United States Patent
Rana (10) Patent No.: US 8,513,086 B2
(45) Date of Patent: Aug. 20, 2013

(54) METHODS FOR ETCHING DOPED OXIDES IN THE MANUFACTURE OF MICROFEATURE DEVICES

(75) Inventor: Niraj Rana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/540,510

(22) Filed: Jul. 2, 2012

(65) Prior Publication Data

US 2012/0276748 A1 Nov. 1, 2012

Related U.S. Application Data

(60) Continuation of application No. 12/875,036, filed on Sep. 2, 2010, now Pat. No. 8,216,911, which is a continuation of application No. 11/871,569, filed on Oct. 12, 2007, now Pat. No. 7,803,686, which is a division of application No. 11/217,894, filed on Sep. 1, 2005, now Pat. No. 7,297,639.

(51) Int. Cl.
*H01L 21/20* (2006.01)

(52) U.S. Cl.
USPC .......... 438/381; 438/724; 438/738; 438/744; 438/757; 257/E21.265

(58) Field of Classification Search
USPC . 438/724, 738, 744, 757, 381; 257/E21.265, 257/E21.215, E21.309
See application file for complete search history.

(56) References Cited

U.S. PATENT DOCUMENTS

| | | | |
|---|---|---|---|
| 3,767,483 A | | 10/1973 | Tokuyama et al. |
| 4,354,897 A | | 10/1982 | Nakajima et al. |
| 4,892,845 A | | 1/1990 | Bridges |
| 5,169,680 A | | 12/1992 | Ting et al. |
| 5,300,463 A | | 4/1994 | Cathey et al. |
| 5,436,188 A | | 7/1995 | Chen |
| 5,616,513 A | | 4/1997 | Shepard |
| 5,759,891 A | * | 6/1998 | Tseng ............................ 438/253 |
| 5,918,120 A | | 6/1999 | Huang |
| 5,994,238 A | | 11/1999 | Park |
| 6,015,734 A | | 1/2000 | Huang et al. |
| 6,033,996 A | | 3/2000 | Rath et al. |
| 6,074,960 A | | 6/2000 | Lee et al. |
| 6,245,640 B1 | * | 6/2001 | Claussen et al. .............. 438/424 |
| 6,276,196 B2 | * | 8/2001 | Mauze et al. ................. 73/64.45 |
| 6,391,793 B2 | | 5/2002 | Lee et al. |
| 6,465,351 B1 | | 10/2002 | Jeong |
| 6,507,064 B1 | | 1/2003 | Tang et al. |
| 6,599,799 B2 | | 7/2003 | Tang et al. |
| 6,607,954 B2 | | 8/2003 | Jeon et al. |
| 6,803,318 B1 | | 10/2004 | Qiao et al. |
| 7,119,390 B2 | * | 10/2006 | Wang .............................. 257/301 |
| 7,404,910 B1 | | 7/2008 | Kezuka et al. |

(Continued)

*Primary Examiner* — Kimberly Rizkallah
*Assistant Examiner* — Caleb Henry
(74) *Attorney, Agent, or Firm* — Perkins Coie LLP (57) ABSTRACT

Methods for selectively etching doped oxides in the manufacture of microfeature devices are disclosed herein. An embodiment of one such method for etching material on a microfeature workpiece includes providing a microfeature workpiece including a doped oxide layer and a nitride layer adjacent to the doped oxide layer. The method include selectively etching the doped oxide layer with an etchant comprising DI:HF and an acid to provide a pH of the etchant such that the etchant includes (a) a selectivity of phosphosilicate glass (PSG) to nitride of greater than 250:1, and (b) an etch rate through PSG of greater than 9,000 Å/minute.

23 Claims, 4 Drawing Sheets

(56) References Cited

U.S. PATENT DOCUMENTS

| | | |
|---|---|---|
| 2002/0142610 A1 | 10/2002 | Chien et al. |
| 2002/0168830 A1 | 11/2002 | DeBoer et al. |
| 2005/0170603 A1 | 8/2005 | Lee et al. |
| 2006/0046513 A1 | 3/2006 | Shea et al. |
| 2007/0049041 A1 | 3/2007 | Rana |
| 2007/0145009 A1 | 6/2007 | Fucsko et al. |
| 2007/0203041 A1 | 8/2007 | Lee |
| 2008/0038896 A1 | 2/2008 | Rana |
| 2010/0330768 A1 | 12/2010 | Rana |

* cited by examiner

METHODS FOR ETCHING DOPED OXIDES IN THE MANUFACTURE OF MICROFEATURE DEVICES

CROSS-REFERENCE TO RELATED APPLICATIONS

This application is a continuation of U.S. application Ser. No. 12/875,036 filed Sep. 2, 2010, now U.S. Pat. No. 8,216,911, which is a continuation of Ser. No. 11/871,569, filed Oct. 12, 2007, now U.S. Pat. No. 7,803,686, which is a divisional of U.S. application Ser. No. 11/217,894, filed Sep. 1, 2005, now U.S. Pat. No. 7,297,639, each of which is incorporated herein by reference in its entirety.

TECHNICAL FIELD

The present invention is directed generally toward methods for etching doped oxides in the manufacture of microfeature devices.

BACKGROUND

Manufacturers of microelectronic devices are continually reducing the size and increasing the density of components in integrated circuits to increase the speed and capacity of the devices while reducing the overall size and power consumption. Memory device manufacturers, for example, seek to increase the capacity of memory devices (e.g., dynamic random access memory (DRAM) circuits) while reducing the size and/or increasing the density of the components in the devices without compromising performance.

DRAM circuits are generally manufactured by replicating millions of identical circuit elements (e.g., memory cells) on a single workpiece. A memory cell is an addressable location that can store one bit (binary digit) of data. Memory cells in DRAM circuits, for example, generally include a storage capacitor and an access field effect transistor. These components can also include a number of different features or structures (e.g., source areas, drain areas, gates, word lines, bit lines, etc.) that are fabricated on the workpiece. As memory cells shrink, however, it is becoming increasingly difficult to fabricate the cells within desired specifications, while simultaneously decreasing the size of the individual cells and increasing the cell density.

One area of particular concern in the manufacture of memory cells is providing capacitors with sufficiently high storage capacitance to maintain a charge at the desired refresh rates. Many manufacturers use three-dimensional capacitor configurations, such as stacked capacitors, to address this problem. Stacked capacitors are stacked or placed over the access transistor for a cell located in the workpiece. One common type of stacked capacitor, for example, is a double-sided container capacitor. A double-sided container capacitor is shaped like an upstanding tube or cylinder having a generally arcuate cross-section. Double-sided container capacitors are advantageous because they generally increase the storage capacitance of the memory cells, and yet reduce the depth of the container. Double-sided capacitors, however, generally require more lateral space than conventional capacitors, and this is not desirable because minimizing the lateral dimensions of the capacitors is necessary to increase circuit density and still electrically isolate the capacitor plates from the bit line contacts. As such, it is desirable to fabricate double-sided container capacitors that can be positioned extremely close together within the device (i.e., a high density of devices).

One particular process in fabricating double-sided capacitors is etching a relatively thick dielectric layer (e.g., a doped oxide layer) adjacent to a portion of the capacitor structure. The doped oxide etching process requires an etchant with a high selectivity to nitride because the lattice that holds the respective container capacitors together is generally made from a nitride. The etching process additionally requires a high selectivity to other materials (e.g., TiN and polysilicon) used to form portions of the capacitor structure.

Conventional etching processes include an etchant comprising a mixture of acetic acid and hydrofluoric acid (e.g., 30:1 ac-HF) to etch the doped oxide material. This etchant has a selectivity of about 250:1 for phosphosilicate glass (PSG) to nitride. Etching processes using this etchant, however, include several drawbacks. For example, the etch rate of PSG using this mixture is relatively slow (e.g., about 2,000 Å/minute) and can require about 6-7 minutes per workpiece. As a result, this process can impact the throughput of the fabrication process because the etching process needs to be run on a single wafer platform to minimize defects. Another drawback is that acetic acid is extremely flammable and difficult to work with because it has a very low flash point. Accordingly, manufacturing tools and processes generally require special safety features and precautions. These extra steps and equipment can significantly increase costs. Furthermore, acetic acid itself is quite expensive compared to other acidic solutions.

Another conventional etching process includes an etchant comprising 10:1 HF. This solution, which can etch PSG at about 9,000 Å/minute, can reduce the etching process time to less than 90 seconds per wafer. Etching processes using an etchant including 10:1 HF, however, also include several drawbacks. For example, the selectivity of this etchant is only about 200:1 for PSG:nitride. This selectivity may not be adequate in the manufacturing of certain devices (e.g., capacitors using low temperature nitrides to mitigate thermal budgets). Additionally, the etchant has a relatively low selectivity to polysilicon and TiN, and these materials can be negatively affected and/or damaged during the doped oxide etching process. Accordingly, there is a need to improve the etching processes used to etch doped oxides in the manufacture of microfeature devices.

DETAILED DESCRIPTION

A. Overview/Summary

The present invention is directed to methods for selectively etching doped oxides, for example, in the formation of double-sided container capacitors. An embodiment of one such method for etching material on a microfeature workpiece includes providing a microfeature workpiece including a doped oxide layer and a nitride layer adjacent to the doped oxide layer. The method includes selectively etching the doped oxide layer with an etchant comprising deionized water and HF (DI:HF) and an acid to provide a pH of the etchant such that the etchant includes (a) a selectivity of PSG to nitride of greater than 250:1, and (b) an etch rate through PSG of greater than 9,000 Å/minute.

In several embodiments, the etchant can include DI:HF and nitric acid ($HNO_3$) having a ratio of DI to HF to $HNO_3$ of about 2:1:X to about 100:1:X. The value X can vary from about 0.0001 to 5. More particularly, the ratio of DI to HF to $HNO_3$ can be about 2:1:X to 30:1:X, where X varies from approximately 0.5-3.0. In other embodiments, the etchant can also include DI:HF and hydrochloric acid (HCl), DI:HF and sulphuric acid ($H_2SO_4$), or DI:HF and phosphoric acid ($H_3PO_4$). The ratios of these chemistries can be approximately the same as the ratios for DI:HF:$HNO_3$ described above.

Another embodiment is directed to a method for fabricating a microfeature device on a microfeature workpiece. The method includes providing a microfeature workpiece including (a) a doped oxide layer, and (b) a nitride material, a polysilicon material, and a TiN material proximate to the doped oxide layer. The method further includes removing substantially all the doped oxide layer with an etchant comprising DI:HF:$HNO_3$. The etchant includes a ratio of DI to HF to $HNO_3$ of 10:1:1.0-2.0 such that the etchant etches up to and generally not into the nitride, polysilicon, and TiN materials.

Still another embodiment is directed to a method for forming a capacitor on a microfeature workpiece. The workpiece includes a plurality of conductive plugs, a first nitride layer over the conductive plugs, a dielectric layer over the first nitride layer, and a second nitride layer over the dielectric layer. The method can include patterning and etching the second nitride layer to form a mask over the dielectric layer. The method continues by forming a plurality of openings in the dielectric layer using the mask. The dielectric layer includes a doped oxide material. The individual openings expose at least a portion of the individual conductive plugs. The method can then include depositing a first conductive layer in at least a portion of the individual openings and in electrical contact with the corresponding conductive plugs. The first conductive layer can include TiN. The method further includes depositing a second conductive layer over at least a portion of the first conductive layer in the individual openings. The second conductive layer can include polysilicon. The method continues by removing at least substantially all the dielectric layer from the workpiece with an etchant comprising DI:HF and an acid to provide a pH of the etchant such that the etchant includes (a) a selectivity of PSG to nitride of greater than 250:1, and (b) an etch rate through PSG of greater than 9,000 Å/minute.

Figure 1:
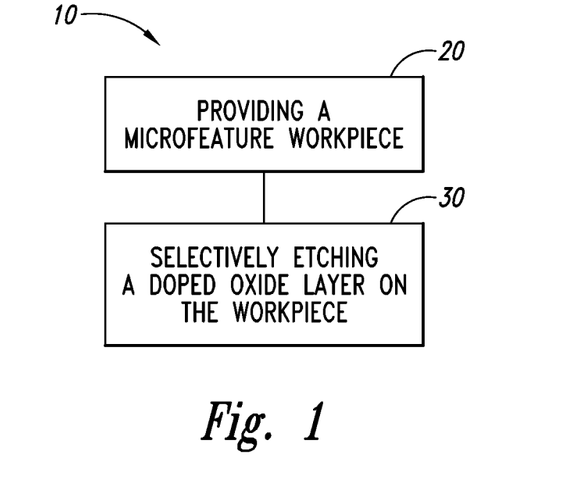
FIG. 1 is a flow diagram illustrating stages in a method for selectively etching doped oxide material on a microfeature workpiece in accordance with several embodiments of the invention.

Several specific details of the invention are set forth in the following description and in FIGS. 1-2F to provide a thorough understanding of certain embodiments of the invention. One skilled in the art, however, will understand that the present invention may have additional embodiments, or that other embodiments of the invention may be practiced without several of the specific features explained in the following description. The term "microfeature workpiece" is used throughout to include substrates upon which and/or in which microelectronic devices, micromechanical devices, data storage elements, optics, and other features are fabricated. Microfeature workpieces generally have at least several features with critical dimensions less than or equal to 1 μm, and in many applications the critical dimensions of the smaller features on microfeature workpieces are less than 0.25 μm or even less than 0.1 μm. For example, microfeature workpieces can be semiconductor wafers, glass substrates, dielectric substrates, or many other types of substrates. Furthermore, the terms "planarization" and "planarizing" mean forming a planar surface, forming a smooth surface (e.g., "polishing"), or otherwise removing materials from workpieces. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

B. Embodiments of Methods for Etching Doped Oxide Materials on Microfeature Workpieces FIG. 1 is a flow chart of a method 10 for selectively etching doped oxide materials on a microfeature workpiece in accordance with several embodiments of the invention. The method 10 includes providing a microfeature workpiece at stage 20. The workpiece can include a doped oxide layer (e.g., PSG or BPSG) and a nitride layer adjacent to the doped oxide layer. At stage 30, the method includes selectively etching the doped oxide layer on the workpiece. For example, the doped oxide layer can be etched with an etchant including DI:HF and an acid to provide a pH of the etchant such that the etchant includes (a) a selectivity of PSG to nitride of greater than 250:1, and (b) an etch rate through PSG of greater than 9,000 Å/minute. Further details of the foregoing method steps and examples of structures formed by executing those steps are described below with reference to FIGS. 2A-2F.

FIGS. 2A-2F illustrate various stages in one embodiment of a method 10 (FIG. 1) of etching doped oxide materials on a microfeature workpiece. More specifically, FIGS. 2A-2F illustrate various stages in a method for etching doped oxide materials during the formation of double-sided container capacitors (e.g., for use in a DRAM circuit). The doped oxide materials can be etched with an etchant including (a) a desired selectivity to nitride, polysilicon, and TiN materials, (b) a relatively high etch rate, and (c) generally little or no acetic acid. Although the following methods for etching doped oxides are described with respect to the formation of double-sided container capacitors, the invention may be used for etching doped oxide materials in the fabrication of a number of other microelectronic features or structures.

Figure 2A:
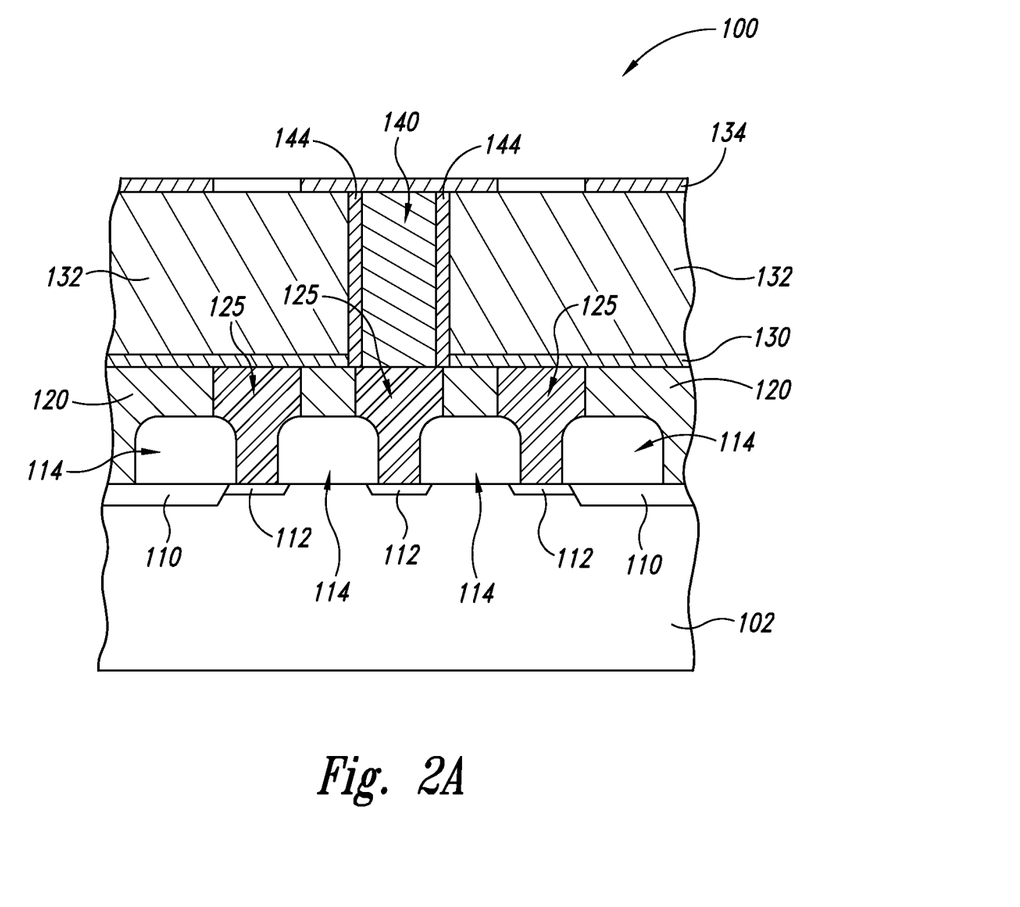
FIGS. 2A-2F illustrate stages in a method of forming a double-sided container capacitor on a microfeature workpiece in accordance with an embodiment of the invention.

FIG. 2A is a side cross-sectional view of a portion of a microfeature workpiece 100 at an intermediate stage of forming the double-sided capacitors on the workpiece 100. The workpiece 100 includes a substrate 102 and a number of other structures and/or layers of material that have been formed on and/or in the substrate 102 in previous processing steps. The substrate 102 can be a semiconductor substrate composed of silicon, gallium arsenide, or other semiconductor materials. The substrate 102 can alternatively be glass or other materials in other applications.

The workpiece 100 includes a plurality of isolation regions 110 (e.g., shallow trench isolation (STI) structures and/or field oxide portions) in the substrate 102 and a plurality of active areas 112. The isolation regions 110 are shallow dielectric regions that electrically isolate the active areas 112. The active areas 112 can include doped or implanted materials that form source regions, drain regions, and other structures. The workpiece 100 further includes gate stacks 114 (shown schematically) formed on the substrate 102. The individual gate stacks 114 can include a gate dielectric layer (e.g., a gate oxide), one or more gate conductive layers (e.g., a conductive polysilicon layer and/or a silicide layer), and one or more dielectric caps (e.g., a silicon nitride layer). In alternative embodiments, the gate stacks 114 can have other configurations and/or include different materials.

The workpiece 100 also includes a first dielectric layer 120 on the substrate 102 and a plurality of conductive plugs 125 electrically coupled to corresponding active areas 112 in the substrate 102. The first dielectric layer 120 can include a doped oxide material, such as borophosphosilicate glass (BPSG), PSG, or another suitable dielectric material. The conductive plugs 125 can include a polysilicon material doped with impurities to enhance conductivity. In alternative embodiments, however, the conductive plugs 125 can be formed from other suitable conductive materials.

The workpiece 100 further includes a second dielectric layer 130 over the first dielectric layer 120 and the conductive plugs 125. The second dielectric layer 130 can include a layer of silicon nitride ($Si_3Ni_4$) that acts as an etch-stop layer for subsequent etching processes, as described in more detail below. A third dielectric layer 132 is over at least a portion of the second dielectric layer 130. The third dielectric layer 132 is a relatively thick (e.g., approximately 10,000-15,000 Å) layer of doped oxide material (e.g., PSG or BPSG). A fourth dielectric layer 134 is over the third dielectric layer 132 and patterned to form openings 135 over at least a portion of the conductive plugs 125. The fourth dielectric layer 134 can include a layer of silicon nitride and/or other suitable materials.

The workpiece 100 also includes a bit line plug 140 extending through at least a portion of the third dielectric layer 132 and in electrical contact with a corresponding conductive plug 125. The bit line plug 140 can include a polysilicon material or another suitable conductive material. The bit line plug 140 includes a fifth dielectric layer 144 (e.g., a layer of silicon nitride) covering the sidewalls of the plug 140 to electrically insulate the bit line plug 140 from other components of the capacitor. In other embodiments, the workpiece 100 may include additional structures or layers, or the workpiece 100 may not include one or more of the layers of materials described above.

Figure 2B:
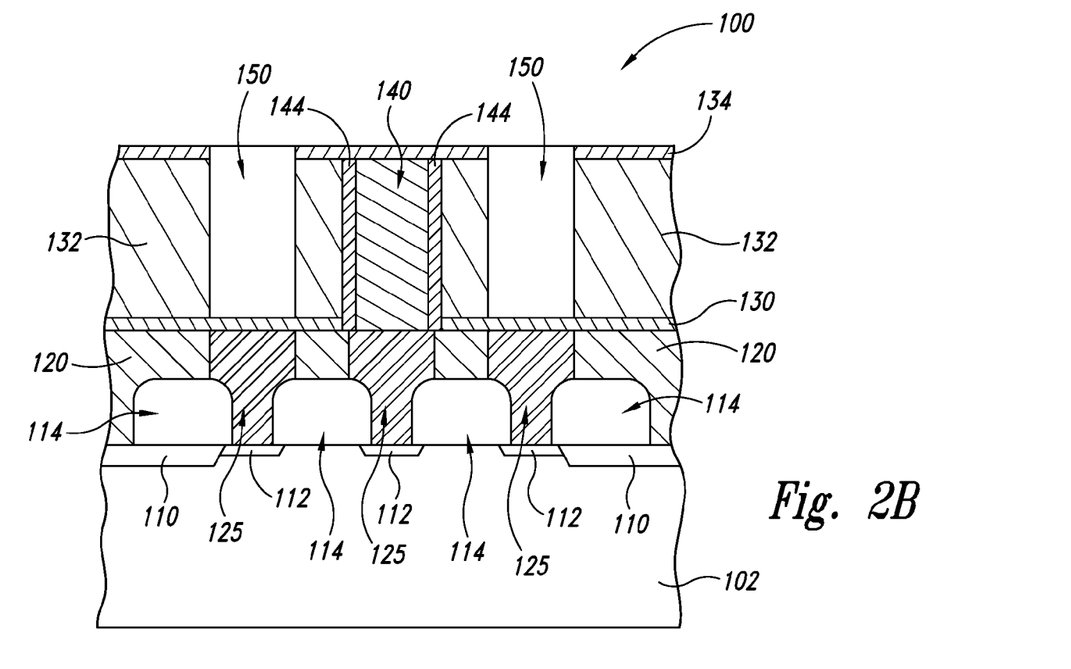

Referring next to FIG. 2B, the third dielectric layer 132 is etched using a first etching process to form openings 150. The openings 150 are blind holes that extend through the third dielectric layer 132 to expose at least a portion of the second dielectric layer 130. For purposes of this specification, a "blind hole" or "blind via" refers to a hole or aperture that extends only partially through a material or is otherwise closed at one end. The first etching process selectively removes material from the third dielectric layer 132 but not the second dielectric layer 130. The second dielectric layer 130 can accordingly act as an etch-stop for the first etching process. The first etching process can include the etchants described below with respect to FIG. 2F or another suitable etching process.

Figure 2C:
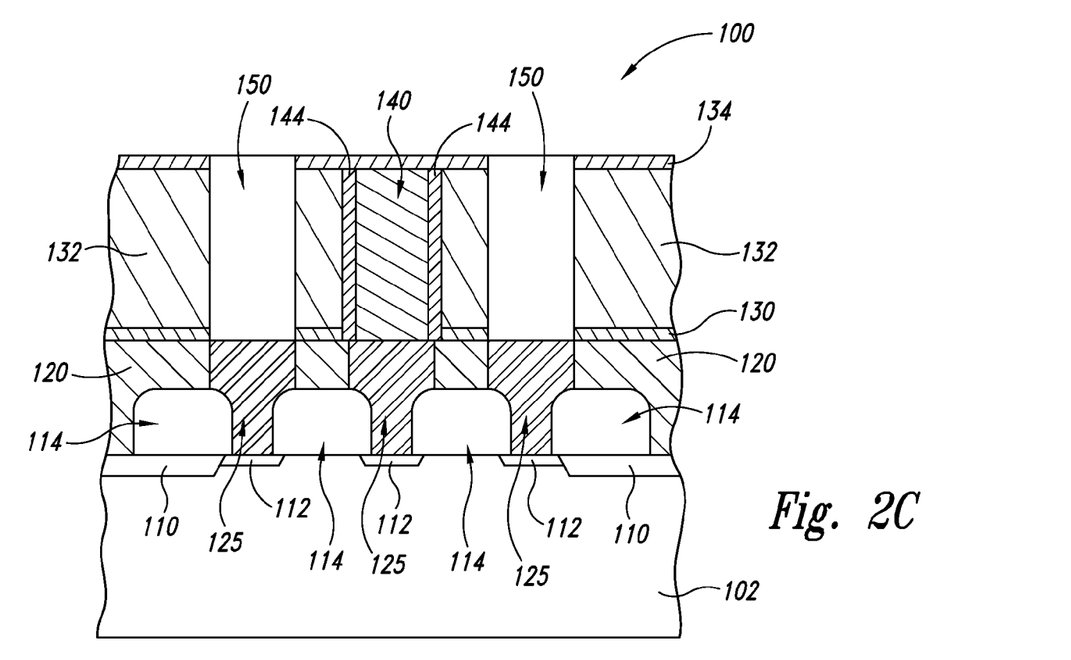

Referring next to FIG. 2C, the second dielectric layer 130 within each opening 150 is etched using a second etching process to expose at least a portion of the corresponding conductive plugs 125 aligned with at least a portion of the individual openings 150. The second etching process can be different than the first etching process because the second dielectric layer 130 can have a different composition than the third dielectric layer 132. For example, the second etching process can be highly selective to the material of the second dielectric layer 130 (e.g., silicon nitride) relative to the material of the conductive plugs 125 (e.g., polysilicon). The second etching process accordingly does not significantly alter the general structure of the conductive plugs 125.

Figure 2D:
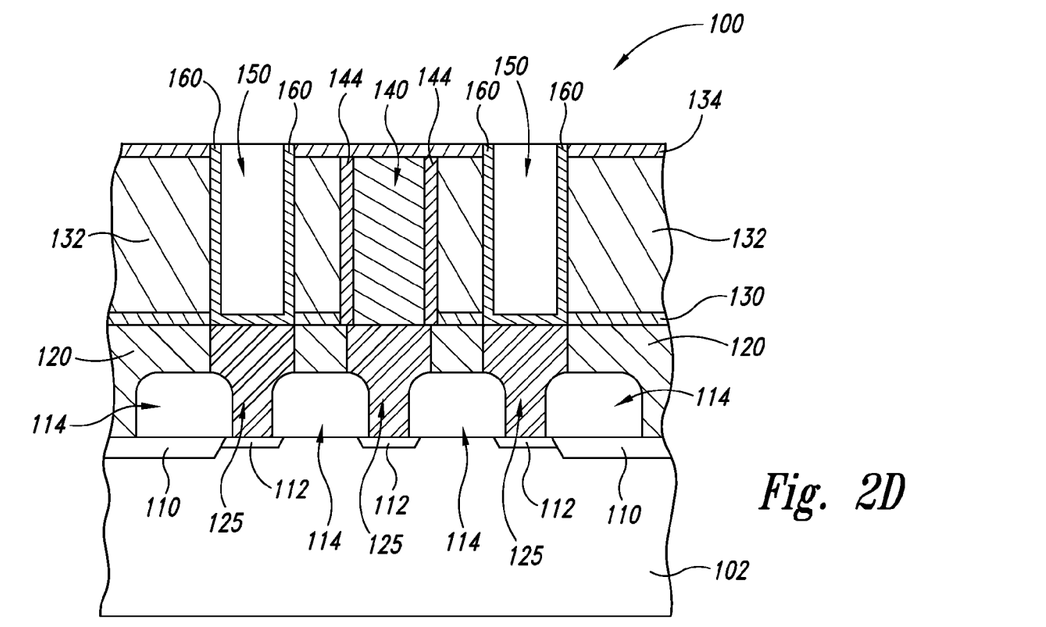

Referring next to FIG. 2D, a first conductive layer 160 is deposited onto the workpiece 100 over the fourth dielectric layer 134 and into the openings 150 to line the sidewalls of the openings 150. The first conductive layer 160 can be in electrical contact with the conductive plugs 125 exposed within the individual openings 150. The first conductive layer 160 is generally a metal layer, such as a TiN layer, that is deposited onto the workpiece 100 using a suitable deposition process. In other embodiments, however, the first conductive layer 160 can be composed of other suitable materials and/or be deposited onto the workpiece 100 using a different process. The first conductive layer 160 provides a material for plating another layer of metal onto only selected areas of the workpiece 100 (e.g., in the openings 150). A chemical-mechanical planarization (CMP) process, grinding process, or suitable etching process can be used to remove portions of the first conductive layer 160 that are outside the openings 150 from the workpiece 100.

Figure 2E:
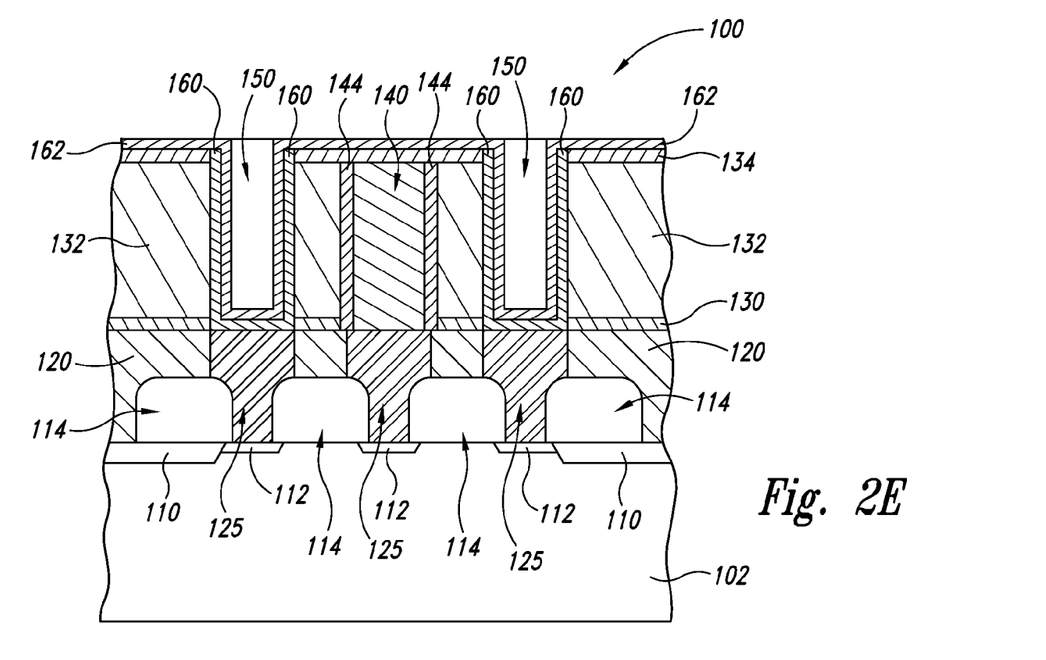

Referring next to FIG. 2E, a second conductive layer 162 is deposited onto the workpiece 100 and over the first conductive layer 160. The second conductive layer 162 can include a polysilicon layer deposited onto the workpiece 100 using a suitable deposition process. In other embodiments, the second conductive layer 162 can include other suitable materials.

Figure 2F:
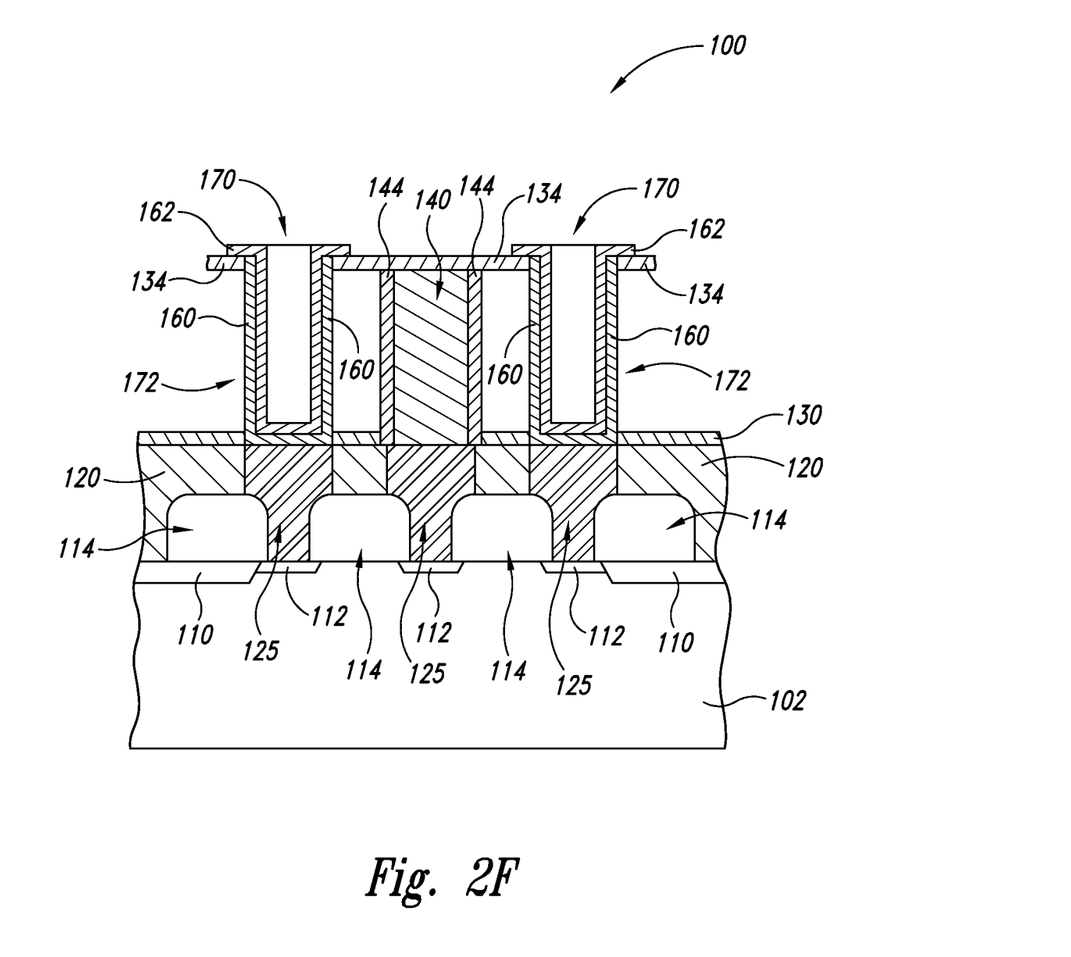

Referring next to FIG. 2F, the second conductive layer 162 and layer 134 are patterned to form openings and the third dielectric layer 132 (FIG. 2E) is etched using a third etching process to form a plurality of container structures 170 on the workpiece. The container structures 170 include sidewalls 172 defined at least in part by the first and second conductive layers 160 and 162. The container structures 170 are supported on the workpiece 100 at least in part by a grid of the remaining portions of the fourth dielectric layer 134. The third etching process selectively removes material from the third dielectric layer 132 (e.g., doped oxide) but not the first and second conductive layers 160 and 162 (e.g., TiN and polysilicon) or the second, fourth, and fifth dielectric layers 130, 134, and 144 (e.g., nitride). These materials can accordingly act as an etch-stop for the third etching process. As described in more detail below, the third etching process should be highly selective to nitride, TiN, and polysilicon because these materials comprise the framework of the container structures 170. In additional processing steps not described in detail herein, the workpiece 100 can undergo further processing to complete construction of the double-sided container capacitors on the workpiece 100.

The third etching process can use an etchant including DI, HF and $HNO_3$ to selectively remove the doped oxide material of the third dielectric layer 132 without negatively affecting the surrounding materials (e.g., nitride, polysilicon, and TiN) on the workpiece 100. As discussed in more detail below, the proper ratio of materials in the etchant can (a) increase the etch rate of doped oxide material, and (b) decrease the etch rate of nitride (i.e., increase the PSG:nitride and BPSG:nitride selectivity). Instead of using $HNO_3$, alternative embodiments can include HCl, $H_2SO_4$, $H_3PO_4$, or another suitable acid that lowers the pH of the etchant below about 2.0 and shifts the equilibrium of the etchant solution from generally associated HF toward more undissociated HF. This shift in equilibrium can significantly increase the selectivity of the etchant (e.g., up to about 400:1 for PSG:nitride). The additives in the mixture should be controlled such that the etchant retains a high selectivity toward polysilicon and TiN.

The etchant can include a ratio of DI to HF to $HNO_3$ of about 2:1:X to about 100:1:X. The value X can vary from about 0.0001 to 5. More particularly, the ratio of DI to HF to HNO3 can be about 2:1:X to 30:1:X, where X varies from approximately 0.5-3.0. The ratios of the alternative etchant chemistries (e.g., DI:HF:HCl, DI:HF:H₂SO₄, or DI:HF:H₃PO₄) can be approximately the same as the ratios for DI:HF:HNO₃.

Although the ratio of DI:HF can be lower than 10 in several embodiments, if the ratio becomes too low the etch rate can become too high and difficult to control. Additionally, the ratio of HF:HNO₃ can be higher than 2.0 in several embodiments, but above this value the etchant becomes significantly less selective to polysilicon and TiN and can etch back too much of these layers on the workpiece 100. A ratio of HF:HNO₃ of approximately 2.0 or less, however, keeps the attack rate of the etchant DI:HF:HNO₃ to a about 4-5 Å/minute for the polysilicon and/or TiN materials. In other embodiments where the polysilicon and/or TiN layers are relatively thick, the ratio of HF:HNO₃ can generally be increased above 2.0 without adverse effects.

One feature of the methods described above for etching doped oxide materials is that the selectivity and etch rate of the etching process can be significantly improved as compared with conventional etching processes. For example, the etchant DI:HF:HNO₃ is expected to provide over a 100% increase in selectivity as compared with conventional etching processes using 10:1 HF. The above-described methods also provide a significant improvement in selectivity as compared with etching processes using ac-HF, which has a selectivity of PSG:nitride of less than 250:1. The increased selectivity of the etchants described above can accordingly allow for higher-density components in microfeature devices and increased precision during manufacturing of the devices.

Another advantage of this feature is that fabrication processes utilizing the above-described etchants can be significantly more efficient as compared with conventional processes. Etching processes including acetic acid, for example, generally have etch rates of about 2,000 Å/minute. Extremely slow etching processes can accordingly significantly reduce throughput of processed devices. In contrast, etch rates using the above-disclosed etchants can be over approximately 9,000 Å/minute. For example, the etchant DI:HF:HNO₃ can provide over a 25% increase in etch rate as compared with conventional etching processes using 10:1 HF. The improvements in etch rate using the above-described methods as compared with conventional processes can significantly increase throughput of processed devices.

Still another feature of the methods described above for etching doped oxide materials is that the etchants described above generally include little or no acetic acid. One advantage of this feature is that fabrication processes involving the etching of doped oxide materials in accordance with several embodiments of the present invention can be significantly less expensive than conventional processes that require acetic acid. Acetic acid is significantly more expensive than other acidic materials, and the safety equipment and procedures necessarily required when using acetic acid (e.g., because of its low flash point) further increase processing costs.

For the foregoing, it will be appreciated that specific embodiments of the invention have been described herein for purposes of illustration, but that various modifications may be made without deviating from the invention. For example, additional acid solutions may be used with the DI:HF solution to lower the pH of the solution and shift the equilibrium of the etchant from associated HF toward more undissociated HF. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A method for etching material on a microfeature workpiece, the method comprising:
    forming a framework on a microfeature workpiece, the framework including a conductive material, a doped oxide material, and a nitride material adjacent to the doped oxide material and the conductive material; and
    selectively etching the doped oxide material over the conductive and nitride materials of the framework with an etchant including DI:HF and an acid to provide a pH of the etchant such that the etchant includes (a) a selectivity of phosphosilicate glass (PSG) to nitride of greater than 250:1, and (b) an etch rate through PSG of greater than 9,000 Å/minute.

2. The method of claim 1 wherein selectively etching the doped oxide material with an etchant including DI:HF and an acid includes etching the doped oxide material a with an etchant including a pH below about 2.0.

3. The method of claim 2 wherein selectively etching the doped oxide material with an etchant including DI:HF and an acid includes etching the doped oxide material with an etchant including DI:HF:HNO₃, the etchant having a ratio of DI to HF to HNO₃ of approximately 2:1:X to approximately 100:1:X, wherein X is a value from 0.0001 to 5.0.

4. The method of claim 2 wherein selectively etching the doped oxide material with an etchant including DI:HF and an acid includes etching the doped oxide material with an etchant including DI:HF:HNO₃, the etchant having a ratio of DI to HF to HNO₃ of approximately 2-30:1:0.5-3.0.

5. The method of claim 2 wherein selectively etching the doped oxide material with an etchant including DI:HF and an acid includes etching the doped oxide material with an etchant including DI:HF: HNO₃, the etchant having a ratio of DI to HF to HNO₃ of approximately 10:1:1.0-2.0.

6. The method of claim 2 wherein selectively etching the doped oxide material with an etchant including DI:HF and an acid includes etching the doped oxide material with an etchant including DI:HF:HCl, the etchant having a ratio of DI to HF to HCl of approximately 2:1:X to approximately 100:1:X, wherein X is a value from 0.0001 to 5.0.

7. The method of claim 2 wherein selectively etching the doped oxide material with an etchant including DI:HF and an acid includes etching the doped oxide material with an etchant including DI:HF:HCl, the etchant having a ratio of DI to HF to HCl of approximately 2-30:1:0.5-3.0.

8. The method of claim 2 wherein selectively etching the doped oxide material with an etchant including DI:HF and an acid includes etching the doped oxide material with an etchant including DI:HF:HCl, the etchant having a ratio of DI to HF to HCl of approximately 10:1:1.0-2.0.

9. The method of claim 2 wherein selectively etching the doped oxide material a with an etchant including DI:HF and an acid includes etching the doped oxide material with an etchant including DI:HF:H₂SO₄, the etchant having a ratio of DI to HF to H₂SO₄ of approximately 2:1:X to approximately 100:1:X, wherein X is a value from 0.0001 to 5.0.

10. The method of claim 2 wherein selectively etching the doped oxide material with an etchant including DI:HF and an acid includes etching the doped oxide material with an etchant including DI:HF:H₂SO₄, the etchant having a ratio of DI to HF to H₂SO₄ of approximately 2-30:1:0.5-3.0.

11. The method of claim 2 wherein selectively etching the doped oxide material with an etchant including DI:HF and an acid includes etching the doped oxide material with an etchant including DI:HF:$H_2SO_4$, the etchant having a ratio of DI to HF to $H_2SO_4$ of approximately 10:1:1.0-2.0.

12. The method of claim 2 wherein selectively etching the doped oxide material with an etchant including DI:HF and an acid includes etching the doped oxide material with an etchant including DI:HF:$H_3SO_4$, the etchant having a ratio of DI to HF to $H_3SO_4$ of approximately 2:1:X to approximately 100:1:X, wherein X is a value from 0.0001 to 5.0.

13. The method of claim 2 wherein selectively etching the doped oxide material with an etchant including DI:HF and an acid includes etching the doped oxide material with an etchant including DI:HF: $H_3SO_4$, the etchant having a ratio of DI to HF to $H_3SO_4$ of approximately 2-30:1:0.5-3.0.

14. The method of claim 2 wherein selectively etching the doped oxide material with an etchant including DI:HF and an acid includes etching the doped oxide material with an etchant including DI:HF:$H_3SO_4$, the etchant having a ratio of DI to HF to $H_3PO_4$ of approximately 10:1:1.0-2.0.

15. The method of claim 2 wherein selectively etching the doped oxide material with an etchant including DI:HF and an acid includes etching the doped oxide material with an etchant having a selectivity of PSG to nitride of greater than about 300:1.

16. The method of claim 2 wherein selectively etching the doped oxide material with an etchant including DI:HF and an acid includes etching the doped oxide material with an etchant having a selectivity of PSG to nitride of greater than about 400:1.

17. The method of claim 2 wherein selectively etching the doped oxide material with an etchant including DI:HF and an acid includes etching the doped oxide material with an etchant having an etch rate of over about 9,500 Å/minute through the doped oxide material.

18. The method of claim 1 wherein selectively etching the doped oxide material with an etchant including DI:HF and an acid includes etching the doped oxide material with an etchant that generally includes no acetic acid.

19. The method of claim 1 wherein forming the framework on the microfeature workpiece comprises forming a microfeature workpiece having a PSG material and/or borophosilicate glass (BPSG) material.

20. The method of claim wherein the conductive material comprises a first conductive material, and wherein the method further comprises:
 depositing the first conductive material over at least a portion of the doped oxide material before etching the doped oxide material, the first conductive material including Titanium Nitride (TiN);
 depositing a second conductive material over at least a portion of the first conductive material before etching the doped oxide material, the second conductive material including polysilicon; and
 wherein selectively etching the doped oxide material includes using an etchant that etches up to and generally not into the first and second conductive materials.

21. The method of claim 1 wherein the selectivity of PSG to the conductive material is greater than 1000:1.

22. The method of claim 1 wherein the conductive material comprises Titanium Nitride (TiN).

23. The method of claim 1 wherein the conductive material comprises polysilicon.

* * * * *

UNITED STATES PATENT AND TRADEMARK OFFICE
CERTIFICATE OF CORRECTION

PATENT NO. : 8,513,086 B2
APPLICATION NO. : 13/540510
DATED : August 20, 2013
INVENTOR(S) : Niraj Rana It is certified that error appears in the above-identified patent and that said Letters Patent is hereby corrected as shown below:

In the Claims

In column 8, line 20, in Claim 2, after "material" delete "a".

In column 8, line 36, in Claim 5, delete "DI:HF: $HNO_3$,the" and insert -- DI:HF:$HNO_3$, the --, therefor.

In column 8, line 55, in Claim 9, after "material" delete "a".

In column 9, line 6, in Claim 12, delete "DI:HF:$H_3SO_4$," and insert -- DI:HF:$H_3PO_4$, --, therefor.

In column 9, line 7, in Claim 12, delete "$H_3SO_4$" and insert -- $H_3PO_4$ --, therefor.

In column 9, line 12, in Claim 13, delete "DI:HF: $H_3SO_4$," and insert -- DI:HF:$H_3PO_4$, --, therefor.

In column 9, line 13, in Claim 13, delete "$H_3SO_4$" and insert -- $H_3PO_4$ --, therefor.

In column 9, line 17, in Claim 14, delete "DI:HF:$H_3SO_4$," and insert -- DI:HF:$H_3PO_4$, --, therefor.

Signed and Sealed this
Twenty-ninth Day of October, 2013

Teresa Stanek Rea
*Deputy Director of the United States Patent and Trademark Office*